United States Patent
Tashiro

[19]

[11] Patent Number: 5,864,254
[45] Date of Patent: *Jan. 26, 1999

[54] DIFFERENTIAL AMPLIFIER CIRCUIT WITH ENLARGED RANGE FOR SOURCE VOLTAGE AND SEMICONDUCTOR DEVICE USING SAME

[75] Inventor: Masafumi Tashiro, Kasuga, Japan

[73] Assignee: Rohm Co., LTD., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 617,583

[22] Filed: Mar. 19, 1996

[30] Foreign Application Priority Data

Apr. 11, 1995 [JP] Japan ................................. 7-085052

[51] Int. Cl.⁶ .................................. H03F 3/45; H03F 3/18
[52] U.S. Cl. .............................. 327/319; 327/58; 327/65; 327/333; 327/562; 330/253
[58] Field of Search ................................. 330/252, 253; 327/52, 53, 63, 65, 66, 72, 85, 89, 58, 62, 309, 315, 318, 319, 320, 321, 324, 333, 560, 561, 562, 563

[56] References Cited

U.S. PATENT DOCUMENTS

| | | | |
|---|---|---|---|
| Re. 31,749 | 11/1984 | Yamashiro | 330/264 |
| 4,062,042 | 12/1977 | Ott | 327/324 |
| 4,066,918 | 1/1978 | Heuner et al. | 327/318 |
| 4,591,801 | 5/1986 | Yamaguchi et al. | 330/253 |
| 4,800,365 | 1/1989 | White et al. | 327/362 |
| 4,818,901 | 4/1989 | Young et al. | 326/27 |
| 4,858,055 | 8/1989 | Okitaka | 327/318 |
| 4,994,756 | 2/1991 | Brilka | 330/260 |
| 5,264,740 | 11/1993 | Wright | 327/63 |
| 5,264,744 | 11/1993 | Mizukami et al. | 326/62 |
| 5,365,123 | 11/1994 | Nakase et al. | 326/84 |
| 5,512,853 | 4/1996 | Ueno et al. | 326/21 |
| 5,565,799 | 10/1996 | Houston | 327/52 |

FOREIGN PATENT DOCUMENTS

5-299983  11/1993  Japan .................................. 327/333

*Primary Examiner*—Timothy P. Callahan
*Assistant Examiner*—Terry L. Englund
*Attorney, Agent, or Firm*—Majestic, Parsons, Siebert & Hsue P.C.

[57] ABSTRACT

A differential amplifier circuit includes a differential amplifier having inversion and non-inversion input terminals and input amplifiers each individually connected to one of these input terminals, serving to receive an input voltage within a certain range and output it as another voltage in a smaller range. The differential amplifier is of a kind using n-type and p-type MOS transistors with threshold voltages given respectively by $V_{thn}$ and $V_{thp}$, and connected to a source voltage $V_{DD}$ and a reference voltage $V_{ref}$. Input voltages to the input amplifiers within the range between $V_{ref}$ and $V_{DD}$, are outputted within the range between $(V_{DD}-V_{thp})$ and $(V_{ref}+V_{thn})$, or preferably between $(V_{DD}-1.5V_{thp})$ and $(V_{ref}+1.5V_{thn})$. The input amplifiers may each comprise a CMOS buffer circuit having an output line connected to the differential amplifier and impedance elements such as resistors or transistors with one connected between the output line and the reference voltage and another connected between the output line and the source voltage.

3 Claims, 3 Drawing Sheets

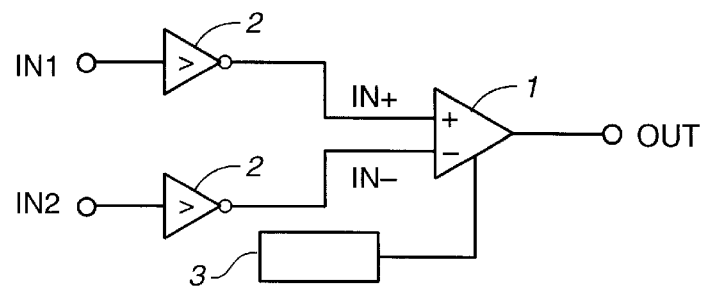
FIG._1
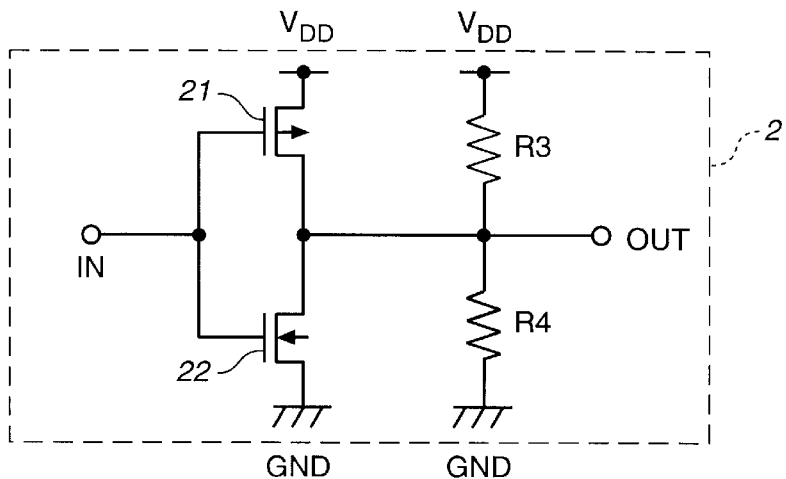
FIG._2A
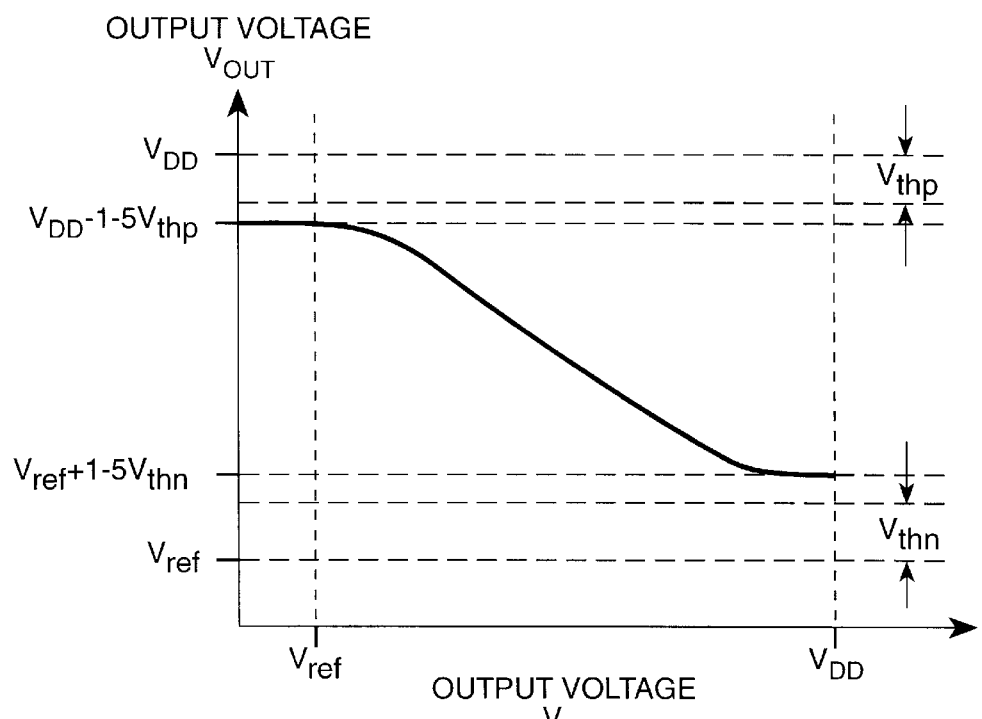
FIG._2B

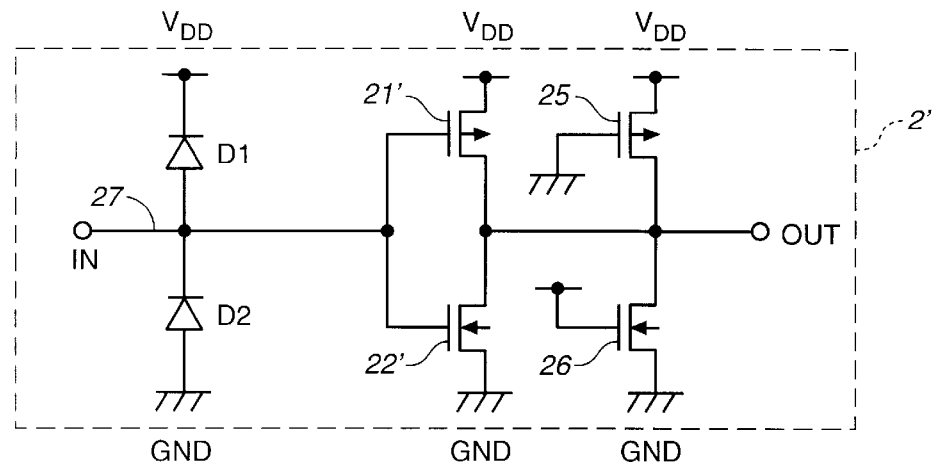
FIG._3
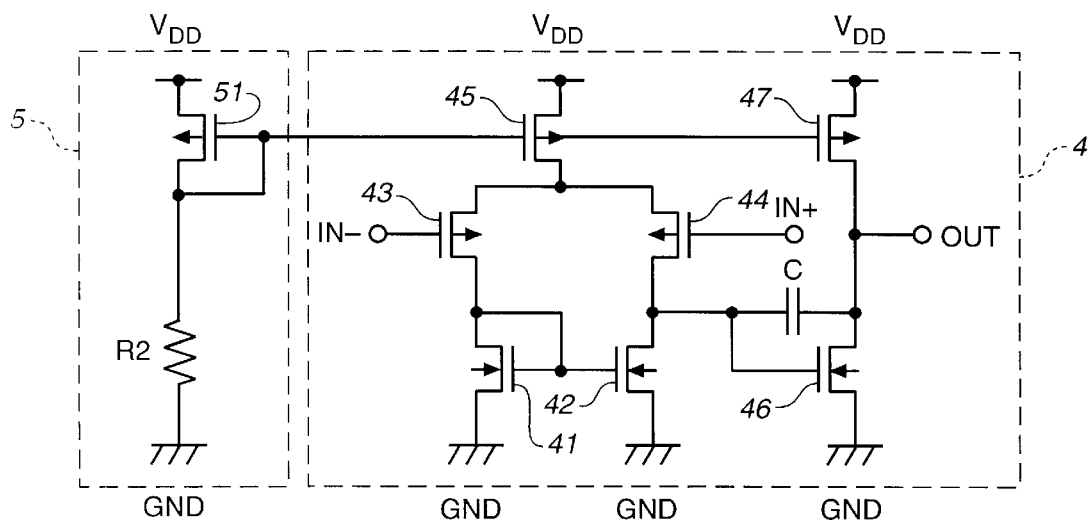
FIG._4
*(PRIOR ART)*

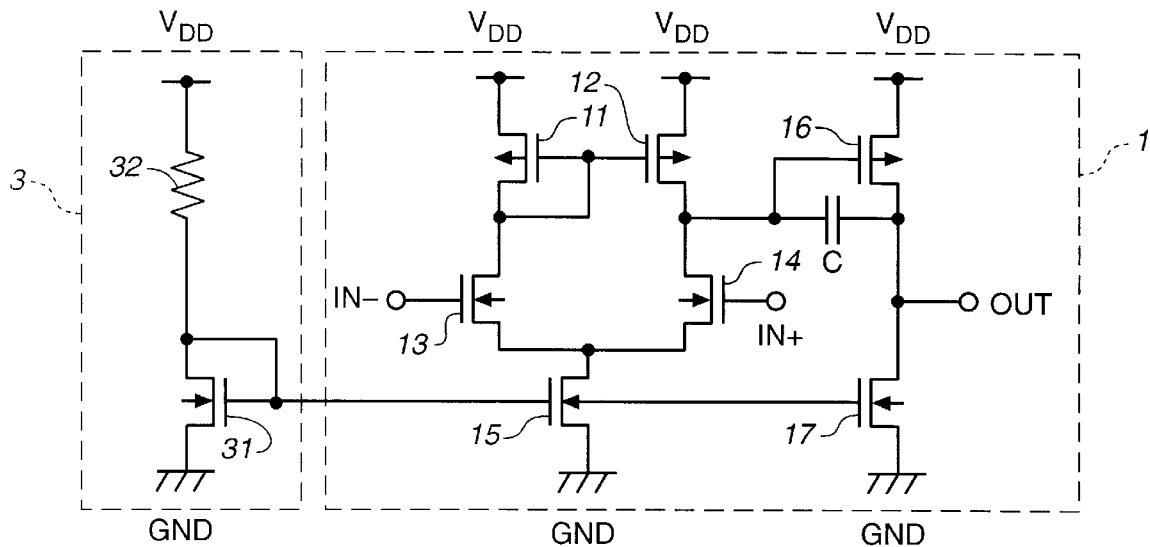
FIG._5 *(PRIOR ART)*
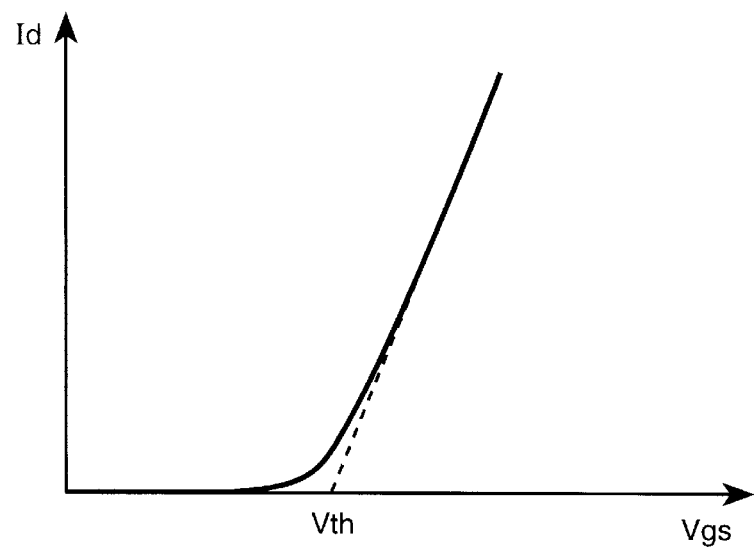
FIG._6
*(PRIOR ART)*
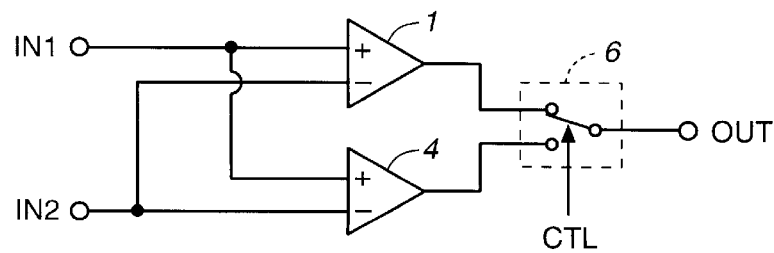
FIG._7
*(PRIOR ART)*

DIFFERENTIAL AMPLIFIER CIRCUIT WITH ENLARGED RANGE FOR SOURCE VOLTAGE AND SEMICONDUCTOR DEVICE USING SAME

BACKGROUND OF THE INVENTION

This invention relates to a differential amplifier circuit and semiconductor devices using such a differential amplifier circuit. More particularly, this invention relates to the circuit structure of a differential amplifier circuit capable of amplifying input voltages in the entire range of source voltage.

For microcomputers adapted to carry out digital processing, for example, logic circuits used to be formed by CMOS processes by which miniaturization is easier. In an interface, however, linear voltages are now frequently handled by using an analog-to-digital (A/D) converter, and MOS transistors are coming to be frequently used for forming linear circuits such as differential amplifiers.

FIG. 5 shows a prior art "n-type" differential amplifier circuit characterized as comprising a differential amplifier 1 using n-channel type MOS transistors (hereinafter referred to as "NMOS") 13 and 14 as a differential pair and a bias circuit 3 for providing a bias voltage to the differential amplifier 1. Explained more in detail, the differential amplifier 1 is of a structure similar to that of a bipolar transistor differential amplifier, comprising a differential pair of NMOS 13 and 14 to which input voltage is supplied respectively as inversion and non-inversion input voltage ($V_{IN-}$ and $V_{IN+}$ at terminals IN− and IN+) through their gates, p-channel type MOS transistors (hereinafter referred to as "PMOS") 11 and 12 connected between a source voltage $V_{DD}$ and the drain respectively of the transistors 13 and 14 and forming a current mirror together, an NMOS 15 connecting together the sources of both transistors 13 and 14 to a reference voltage GND, and an inversion amplifier (or a buffer circuit) comprised of transistors 16 and 17, the gate and the source of transistor 16 being connected respectively to the junction between transistors 12 and 14 and to the source voltage $V_{DD}$, and transistor 17 being connected in series between the drain of transistor 16 and the reference voltage GND. An output terminal (OUT) is connected to a junction between transistors 16 and 17. The gate and the drain of the PMOS 16 are connected through a phase-compensating capacitor C for reducing the gain of the amplifier during a high-frequency operation so as to prevent oscillations. The bias circuit 3 comprises an NMOS 31 (or a transistor diode) with its gate and drain connected together and a resistor 32 connected between the drain of the NMOS 31 and the source voltage $V_{DD}$. The drain of the NMOS 31 is connected to the gates of the transistors 15 and 17.

To briefly explain the operation of the circuit shown in FIG. 5, the operating current of the differential amplifier 1 is determined by the voltage generated in the bias circuit 3 as the sum of the currents flowing through the NMOS 13 and 14. When $V_{IN-}$ and $V_{IN+}$ are equal to each other, NMOS 13 and 14 are balanced, one half of the total operating current flowing through each of NMOS 13 and 14. When input voltage $V_{IN+}$ becomes higher than input voltage $V_{IN-}$, the current flowing through NMOS 13 becomes smaller and the voltage between its source and drain becomes larger. As a result, the gate voltage of PMOS 11 rises in order to reduce the current which flows to PMOS 11. Since this also reduces the current flowing to PMOS 12, the output voltage $V_{OUT}$ at the gate of PMOS 16 drops and the current flowing to PMOS 16 increases. As a result, it operates such that the output voltage $V_{OUT}$ will increase. When input voltage $V_{IN+}$ becomes lower than input voltage $V_{IN-}$, on the other hand, it operates such that the output voltage $V_{OUT}$ will decrease.

The transistor characteristic of NMOS is as schematically shown in FIG. 6, having a threshold value $V_{th}$. Thus, if the voltage $V_{gs}$ between the gate and the source of transistor 13 or 14 of the differential pair 1 of FIG. 5 becomes lower than the threshold value $V_{th}$, the current $I_d$ therethrough will drop nearly to zero. In other words, the differential pair 1 will cease to operate as described above or its frequency characteristic deteriorates substantially if the input voltage $V_{IN+}$ or $V_{IN-}$ becomes lower than $V_{th}$. Similarly, a so-called "p-type" differential amplifier, which uses PMOS for its differential pair, ceases to operate normally if a voltage greater than $V_{DD}-V_{th}$ is inputted as input voltage.

Use has frequently been made of circuits as shown in FIG. 7 in order to address to the problems described above. The differential amplifier circuit shown in FIG. 7 is characterized by a parallel combination of a p-type differential amplifier 4 using PMOS for its differential pair and an n-type differential amplifier 1 (as described above with reference to FIG. 5). There is also provided a switching circuit 6 (controlled by a control signal CTL) for selecting the output from the appropriate one of the differential amplifiers 1 and 4 which will carry out the normal amplification operation in response to the input voltage (received through input terminals IN1 and IN2), such (received through input terminals IN1 and IN2), such that the range of acceptable input voltage is expanded.

Although a circuit of the type shown in FIG. 7 has the advantage of enlarging the range of acceptable input voltage, there are disadvantages in that two differential amplifiers, a switching circuit and a control unit therefor are required. As a result, both the total number of elements for the circuit and its area increase significantly, and this affects the unit price of the semiconductor device incorporating it. Moreover, it involves a difficult process of matching the characteristics of the differential amplifiers 1 and 4, as well as their offset voltages.

SUMMARY OF THE INVENTION

It is therefore a general object of this invention to eliminate the problems of prior art technology described above.

It is a specific object of this invention to provide a differential amplifier circuit capable of properly amplifying input signals of all input voltages without significantly increasing the size of the circuit.

A differential amplifier circuit embodying this invention, with which the above and other objects can be accomplished, may be characterized as comprising a differential amplifier having an inversion input terminal and a non-inversion input terminal and input amplifiers each individually connected to one of these two (inversion and non-inversion) input terminals of the differential amplifier and serving to receive an input voltage within a certain range ("first range") and to output it as another voltage in another range ("second range") which is smaller than the "first range". The differential amplifier is of a kind using n-type and p-type MOS transistors with threshold voltage given respectively by $V_{thn}$ and $V_{thp}$, and connected to a source voltage $V_{DD}$ and a reference voltage $V_{ref}$. The first range is between $V_{ref}$ and $V_{DD}$, and the second range is between $(V_{DD}-V_{thp})$ and $(V_{ref}+V_{thn})$, or preferably between $(V_{DD}-1.5V_{thp})$ and $(V_{ref}+1.5V_{thn})$. With the addition of such input amplifiers, the differential amplifier can carry out an intended amplification operation reliably over an entire range of input voltage between the reference voltage (such as ground potential) and the source voltage for the amplifier.

Each of the input amplifiers according to this invention may be characterized as comprising a CMOS buffer circuit having an output line connected to the differential amplifier and impedance elements such as resistors or transistors with one connected between the output line and a reference voltage and another connected between the output line and a source voltage. A differential amplifier circuit according to this invention has a simpler circuit structure, requiring a smaller surface area, and hence can be more conveniently used in all kinds of IC devices.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a block diagram showing the general structure of a semiconductor device embodying this invention;

FIG. 2A is a circuit diagram of each of the input amplifier shown in FIG. 1 and FIG. 2B is the input-output characteristic of the input amplifier shown in FIG. 2A;

FIG. 3 is a circuit diagram of another input amplifier which may be used in the device shown in FIG. 1;

FIG. 4 is a circuit diagram of a differential amplifier of the p-type which may be used in a device according to this invention;

FIG. 5 is a circuit diagram of a prior art n-type differential amplifier;

FIG. 6 is a graph of the characteristic of an NMOS transistor; and

FIG. 7 is a block diagram of a prior art differential amplifier circuit adapted to operate on input voltages in the entire range of input voltage.

Throughout herein, some of the components which are substantially identical or function similarly, although they are in different circuits, are indicated by the same numeral and are not separately and repetitiously explained in detail.

DETAILED DESCRIPTION OF THE INVENTION

The invention is described next in detail by way of examples with reference to FIGS. 1 through 4, in which some of the numerals used in and explained above with reference to FIG. 5 are used to indicate components which are substantially identical or function similarly.

FIG. 1 shows an example of differential amplifier circuit according to this invention. Use is made of a prior art differential amplifier 1 but its inversion and non-inversion terminals IN– and IN+ are each connected to the output terminal (OUT in FIG. 2A) of an input amplifier 2, which serves to reduce the voltage level of the input voltage and of which the input terminal (IN in FIG. 2A and IN1 or IN2 in FIG. 1) serves to have an input voltage ($V_{IN1}$ or $V_{IN2}$) applied thereon. Numeral 3 in FIG. 1 again indicates a bias circuit for selecting an operating current for the differential amplifier 1, as shown in and explained with reference to FIG. 5.

Each of the input amplifiers 2 shown in FIG. 1 is structured as shown in FIG. 2A, comprising a pair of transistors 21 and 22 which are connected in series between a source voltage line (at voltage $V_{DD}$) and the ground GND (at reference voltage $V_{ref}$) and a pair of resistors R3 and R4 which are similarly connected in series between the source voltage line and the reference voltage. The transistors 21 and 22 are connected in the form of a CMOS inverter, each having its gate and drain connected together, and a junction between the two transistors 21 and 22 is connected to a junction between the two resistors R3 and R4. The input and output terminals (IN and OUT) of the input amplifier 2 are connected respectively to the gates of the transistors 21 and 22 and to the junction between the two resistors R3 and R4.

Let $V_{thp}$ and $V_{thn}$ respectively indicate the threshold voltage of PMOS and NMOS. The element characteristics of the MOS transistors and the resistance values of the resistors R3 and R4 are preferably selected such that the output voltage $V_{OUT}$ at the output terminal OUT will change approximately linearly from ($V_{DD}-V_{thp}$) to ($V_{ref}+V_{thn}$) within this range as the input voltage $V_{IN}$ changes from $V_{ref}$ to $V_{DD}$. It is further preferable to make adjustments such that the output voltage will change approximately linearly from about ($V_{DD}-1.5V_{thp}$) to about ($V_{ref}+1.5V_{thn}$), as shown in FIG. 2B, for improving the frequency characteristics. If the output voltage can satisfy this condition, the amplifier circuit can be operated normally for all input voltages within the entire range of the source voltage including voltages above the source voltage and below the reference voltage.

FIG. 3 shows another input amplifier 2' which is similar to the input amplifier 2 described above with reference to FIG. 2A in that it comprises a pair of transistors 21' and 22' which are connected in series between a source voltage line (at voltage $V_{DD}$) and the ground GND (at reference voltage $V_{ref}$) in the form of a CMOS inverter, each having its gate and drain connected together. Instead of the resistors R3 and R4 as shown in FIG. 2A, however, there is provided a pair of transistors 25 and 26 connected in series with respect to each other also between the source voltage line and the ground, parallel to the series connection of the transistors 21' and 22' to serve as active resistors. A junction between the two transistors 21' and 22' is connected to a junction between the transistors (active resistors) 25 and 26. Input and output terminals (IN and OUT) of the input amplifier 2' are connected respectively to the gates of the transistors 21' and 22' (through an "inverter input line" 27) serving as the input end of the CMOS inverter formed thereby and to the junction between the two transistors 25 and 26. Diodes D1 and D2, serving as protective elements, are further provided to inverter input line 27. This embodiment is advantageous, compared to the example shown in FIG. 2A, in that resistance can be provided by requiring a smaller surface area. Because the dependence of the resistance values of the active resistors on the source voltage is similar to that of the output transistors, furthermore, this embodiment is capable of stabilizing the input-output characteristic against the source voltage.

FIG. 4 shows another differential amplifier circuit which may be used in connection with the present invention, characterized as comprising a p-type differential amplifier 4 using a differential pair of PMOS and a bias circuit 5 for supplying a bias voltage to the differential amplifier 4. Explained more in detail, this differential amplifier 4 includes a differential pair of PMOS 43 and 44 to which input voltage is applied respectively as the non-inversion input (IN+) and the inversion input (IN), NMOS 41 and 42 forming a current mirror which is connected to the drains of the PMOS 43 and 44, another PMOS 45 connected together to the sources of PMOS 43 and 44, and a buffer circuit with transistors 46 and 47 at a junction between which is connected an output terminal (OUT). A phase-compensating capacitor C is connected between the gate and the drain of PMOS 46 for reducing the gain of the amplifier when operating at a high frequency so as to prevent oscillations.

The bias circuit 5 comprises a transistor diode PMOS 51 and a resistor R2 connected between the drain of the PMOS 51 and the ground voltage GND. In order to improve characteristics such as offset, it is preferable to use transistors with same characteristics (with good pairing characteristics) as NMOS 41 and 42 and PMOS 43 and 44.

The differential amplifier 4 carries out amplification in the same way as described above with reference to the n-type differential amplifier 1 shown in FIG. 5 except that it operates with input voltage lower than ($V_{DD}-V_{thp}$).

The invention has been described above with reference to only a limited number of examples, but these examples are not intended to limit the scope of the invention. Many modifications and variations are possible within the scope of the invention. For example, many different circuits can be used for the differential amplifier and bias. The resistors to be used in the input amplifiers may generally be any impedance elements such as polysilicon resistors, diffusion resistors, pinch resistors and conductive resistors (or ON resistors) as shown in FIG. 3. The differential amplifier circuits according to this invention can be used in all kinds of IC devices inclusive of packaged IC circuits. In summary, the disclosure is intended to be interpreted as broadly and allowable reasonably.

What is claimed is:

1. A differential amplifier circuit comprising:

a differential amplifier having an inversion input terminal and a non-inversion input terminal, comprising n-type and p-type MOS transistors with threshold voltages given respectively by $V_{thn}$ and $V_{thp}$, and being connected to a source voltage $V_{DD}$ and a reference voltage $V_{ref}$, and input amplifiers each comprising a CMOS buffer circuit having an output line connected to said differential amplifier and impedance elements including one impedance element connected between said output line and said reference voltage and another impedance element connected between said output line and said source voltage, said input amplifiers including one input amplifier which is connected to said inversion terminal and another input amplifier which is connected to said non-inversion terminal of said differential amplifier, each of said input amplifiers functioning so as to supply to said differential amplifier an output voltage corresponding to any input voltage within a first range between $V_{ref}$ and $V_{DD}$ received thereby, said output voltage changing with respect to said input voltage within a second range which is between $V_{DD}-1.5V_{thp}$ and $V_{ref}+1.5V_{thn}$.

2. A differential amplifier circuit comprising:

a differential amplifier having an inversion input terminal and a non-inversion input terminal; and input amplifiers including one input amplifier which is connected to said inversion terminal and another input amplifier which is connected to said non-inversion terminal of said differential amplifier, each of said input amplifiers functioning so as to supply to said differential amplifier an output voltage corresponding to any input voltage within a first range received thereby, said output voltage changing with respect to said input voltage within a second range which is smaller than said first range, each of said input amplifiers comprising:

a CMOS buffer circuit having an output line connected to said differential amplifier; and impedance elements including one impedance element connected between said output line and a reference voltage $V_{ref}$ and another impedance element connected between said output line and a source voltage $V_{DD}$;

said differential amplifier comprising n-type and p-type MOS transistors with threshold voltages given respectively by $V_{thn}$ and $V_{thp}$, and being connected to said source voltage $V_{DD}$ and said reference voltage $V_{ref}$, said first range being between $V_{ref}$ and $V_{DD}$, said second range being between $V_{DD}-1.5V_{thp}$ and $V_{ref}+1.5V_{thn}$.

3. A semiconductor circuit comprising:

a differential amplifier having an inversion input terminal and a non-inversion input terminal;

input amplifiers including one input amplifier which is connected to said inversion terminal and another input amplifier which is connected to said non-inversion terminal of said differential amplifier, each of said input amplifiers functioning so as to supply to said differential amplifier an output voltage corresponding to any input voltage within a first range received thereby, said output voltage changing with respect to said input voltage within a second range which is smaller than said first range; and a bias circuit connected to said differential amplifier and adapted to supply a bias voltage to said differential amplifier, each of said input amplifiers comprising:

a CMOS buffer circuit having an output line connected to said differential amplifier; and impedance elements including one impedance element connected between said output line and a reference voltage $V_{ref}$ and another impedance element connected between said output line and a source voltage $V_{DD}$;

said differential amplifier comprising n-type and p-type MOS transistors with threshold voltages given respectively by $V_{thn}$ and $V_{thp}$, and being connected to said source voltage $V_{DD}$ and said reference voltage $V_{ref}$, said first range being between $V_{ref}$ and $V_{DD}$, said second range being between $V_{DD}-1.5V_{thp}$ and $V_{ref}+1.5V_{thn}$.

* * * * *